United States Patent
Wei et al.

[11] Patent Number: 5,908,041
[45] Date of Patent: *Jun. 1, 1999

[54] METHOD FOR CLEANING A PHOTORESIST DEVELOPER SPRAY STREAM NOZZLE

[75] Inventors: Gey-Fung Wei, Mai-Lie; Tsun-Ching Lin, Hsin-Chu; Jo-Fei Wang, Hsin-Chu; Hsiao-Lan Yeh, Hsin-Chu, all of Taiwan

[73] Assignee: Taiwan Semiconductor Manufacturing Company, Ltd., Hsin-Chu, Taiwan

[ * ] Notice: This patent issued on a continued prosecution application filed under 37 CFR 1.53(d), and is subject to the twenty year patent term provisions of 35 U.S.C. 154(a)(2).

[21] Appl. No.: 08/682,467

[22] Filed: Jul. 17, 1996

[51] Int. Cl.$^6$ ....................................................... B08B 9/00
[52] U.S. Cl. ................................... 134/22.12; 422/129.1; 422/184.1; 422/186; 422/211; 422/255; 134/2; 134/3; 134/4; 134/6; 134/10; 134/15; 134/19; 134/22.1; 134/22.11; 134/22.13; 134/22.14; 134/22.16; 134/22.17; 134/22.18; 134/22.19; 134/23; 134/24; 134/26; 134/40; 134/41
[58] Field of Search ................................. 422/129, 184.1, 422/186, 211, 255; 134/2, 3, 4, 6, 10, 15, 19, 22.1, 22.11, 22.12, 22.13, 22.14, 22.16, 22.17, 22.18, 22.19, 23, 24, 26, 40, 41

[56] References Cited

U.S. PATENT DOCUMENTS

| | | | |
|---|---|---|---|
| 4,682,614 | 7/1987 | Silvernail et al. | 134/99 |
| 4,682,615 | 7/1987 | Burkman et al. | 134/102 |
| 4,778,532 | 10/1988 | McConnell et al. | 134/10 |
| 4,806,453 | 2/1989 | Vidusek et al. | 430/312 |
| 5,183,066 | 2/1993 | Hethcoat | 134/54 |
| 5,185,235 | 2/1993 | Sato et al. | 430/331 |
| 5,435,488 | 7/1995 | Abiko | 239/110 |

*Primary Examiner*—Ardin H. Marschel
*Attorney, Agent, or Firm*—George O. Saile; Stephen B. Ackerman; Alek P. Szecsy

[57] ABSTRACT

A method and apparatus for cleaning a spray stream nozzle employed in dispensing upon a photoexposed blanket photoresist layer formed over a semiconductor substrate a photoresist developer solution. There is first provided a spray stream nozzle having a minimum of one aperture formed therein. There is then provided through the spray stream nozzle a volume of a photoresist developer solution sufficient to develop a photoexposed blanket photoresist layer formed over a semiconductor substrate placed beneath the spray stream nozzle. Finally, there is provided then through the spray stream nozzle a volume of a solvent which is not susceptible to clogging the spray stream nozzle.

12 Claims, 3 Drawing Sheets

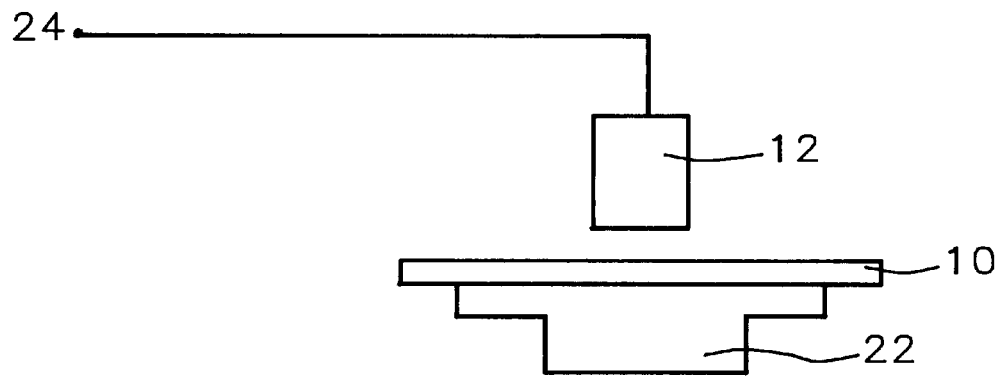
FIG. 6 – Prior Art
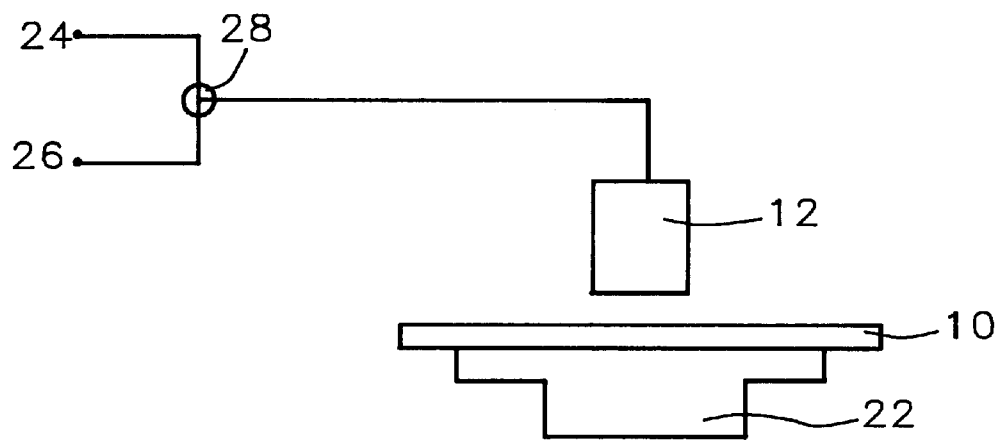
FIG. 7 ns,041

METHOD FOR CLEANING A PHOTORESIST DEVELOPER SPRAY STREAM NOZZLE

BACKGROUND OF THE INVENTION

1. Field of the Invention

The present invention relates generally to spray stream nozzles employed in dispensing wet chemical photoresist developer solutions for developing photoexposed blanket photoresist layers within integrated circuits. More particularly, the present invention relates to an apparatus incorporating a spray stream nozzle, and a method for cleaning the spray stream nozzle, to avoid clogging of the spray stream nozzle when employed in dispensing wet chemical photoresist developer solutions for developing photoexposed blanket photoresist layers within integrated circuits.

2. Description of the Related Art

In the method within integrated circuit fabrication for developing latent images within photoexposed blanket photoresist layers to form patterned photoresist layers from those photoexposed blanket photoresist layers, it has become common in the art to employ a spray stream nozzle to dispense a wet chemical photoresist developer solution employed in developing a patterned photoresist layer from the photoexposed blanket photoresist layer. The use of spray stream nozzles is desirable since in addition to efficiently providing a metered amount of wet chemical photoresist developer solution upon a photoexposed blanket photoresist layer the wet chemical photoresist developer solution is also provided to the photoexposed blanket photoresist layer surface at an accelerated velocity which assists in dissolving appropriate portions of the photoexposed blanket photoresist layer to form the desired patterned photoresist layer.

While the use of spray stream nozzles to dispense upon photoexposed blanket photoresist layers within integrated circuits uniformly metered photoresist developer solutions at enhanced linear velocities has become quite common in the art, the use of such spray stream nozzles to deliver uniformly metered photoresist developer solutions at enhanced linear velocities is not entirely without problems. In particular, it is known in the art that spray stream nozzles which are commonly employed to dispense upon photoexposed blanket photoresist layers within integrated circuits photoresist developer solutions are susceptible to clogging which substantially impedes the desired photoresist developer flow through the nozzle. In addition, the clogging may also lead to particulate residue deposition upon photoexposed blanket photoresist layers desired to be developed through contact with the photoresist developer solution. The clogging presumably derives from recrystallization within the spray stream nozzle of solids typically dissolved in the photoresist developer solution. The particulate residue deposition presumably derives from deposition of recrystallized solids forced through a partially clogged spray stream nozzle. Such recrystallized solids typically include recrystallized active agents within the photoresist developer solution, as well as recrystallized surfactants and other additives commonly incorporated into the photoresist developer solution. The clogging and particulate deposition are particularly prevalent as diameters of apertures within spray stream nozzles approach the range of about 0.05 to about 0.2 millimeters (mm), which range is commonly employed to achieve the enhanced photoresist developer solution linear velocities desired for developing photoexposed blanket photoresist layers within advanced integrated circuits.

Thus, it is desirable in the art of integrated circuit fabrication to provide a method for cleaning a spray stream nozzle employed in dispensing a photoresist developer solution upon a photoexposed blanket photoresist layer so that: (1) clogging of the spray stream nozzle may be avoided; and (2) particulate residue deposition from the spray stream nozzle onto the photoexposed blanket photoresist layer may also be avoided. It is towards providing a method and a spray stream nozzle in accord with these goals that the present invention is directed.

Methods and apparatus through which clogging of spray nozzles may be avoided or through which clogged spray nozzles may be cleaned are disclosed in the art. For example, Hethcoat in U.S. Pat. No. 5,183,066 discloses a spray nozzle cleaning apparatus and spray nozzle cleaning method appropriate for cleaning spray nozzles employed in paint spray guns. In addition, Abiko in U.S. Pat. No. 5,435,488 discloses a spray nozzle employed in spraying solvent borne coatings and adhesives, as well as a method through which the spray nozzle may be employed. The spray nozzle exhibits reduced susceptibility to clogging.

Desirable in the art are additional methods and apparatus through which a spray stream nozzle employed in dispensing a wet chemical photoresist developer solution onto a photoexposed blanket photoresist layer within an integrated circuit may be cleaned to avoid: (1) clogging of the spray stream nozzle; or (2) deposition from the spray stream nozzle of a particulate residue upon the photoexposed blanket photoresist layer.

SUMMARY OF THE INVENTION

A first object of the present invention is to provide a method and apparatus through which a spray stream nozzle employed in dispensing within integrated circuit fabrication wet chemical photoresist developer solutions onto photoexposed blanket photoresist layers may be cleaned to avoid clogging of the spray stream nozzle.

A second object of the present invention is to provide a method and apparatus through which a spray stream nozzle employed in dispensing within integrated circuit fabrication wet chemical photoresist developer solutions onto photoexposed blanket photoresist layers may be cleaned to avoid depositing particulate residues upon the photoexposed blanket photoresist layers.

A third object of the present invention is to provide a method and apparatus in accord with the first object of the present invention or the second object of the present invention, which method and apparatus are readily manufacturable.

In accord with the objects of the present invention, there is provided by the present invention a spray stream nozzle and a method by which the spray stream nozzle may be employed to dispense a photoresist developer solution onto a photoexposed blanket photoresist layer within an integrated circuit. To practice the method of the present invention there is provided a spray stream nozzle having a minimum of one aperture formed therein. There is then provided through the spray stream nozzle a volume of a photoresist developer solution sufficient to develop a photoexposed blanket photoresist layer formed over a semiconductor substrate placed beneath the spray stream nozzle. Finally, there is then provided through the spray stream nozzle a volume of a solvent, which solvent is not susceptible to clogging the spray stream nozzle.

The spray stream nozzle which is employed through the method of the present invention has incorporated therein a means for alternatively supplying to the spray stream nozzle: (1) the volume of the photoresist developer solution employed in developing the photoexposed blanket photoresist layer formed over the semiconductor substrate placed beneath the spray stream nozzle; and (2) the volume of solvent which is not susceptible to clogging the spray stream nozzle.

The present invention provides a method and apparatus through which a spray stream nozzle employed in dispensing a photoresist developer solution upon a photoexposed blanket photoresist layer within an integrated circuit may be cleaned to avoid: (1) clogging of the nozzle; or (2) deposition of a particulate residue upon the photoexposed blanket photoresist layer. The method of the present invention provides, subsequent to dispensing a photoresist developer solution from a spray stream nozzle, for purging the spray stream nozzle with a solvent which is not susceptible to clogging the spray stream nozzle. Thus, through the method of the present invention, and through a spray stream nozzle incorporated into an apparatus through which there may alternatively be provided to the spray stream nozzle a volume of photoresist developer solution and a volume of solvent in accord with the method of the present invention, there is provided a spray stream nozzle apparatus which is susceptible to neither clogging nor deposition of a particulate residue upon a photoexposed blanket photoresist layer when dispensing a photoresist developer solution upon the photoexposed blanket photoresist layer when employing the spray stream nozzle.

The method and apparatus of the present invention are readily manufacturable. The method and apparatus of the present invention provide alternatively to a spray stream nozzle a photoresist developer solution and a solvent which is not susceptible to clogging the spray stream nozzle. Methods and apparatus through which multiple solutions and solvents may be provided to a spray stream nozzle are readily manufacturable.

BRIEF DESCRIPTION OF THE DRAWINGS

The objects features and advantages of the present invention are understood within the context of the Description of the Preferred Embodiment, as set forth below. The Description of the Preferred Embodiment is understood within the context of the following drawings, which form a material part of this disclosure, wherein:

FIG. 6 shows a schematic piping diagram corresponding with the schematic perspective-view diagrams of the method and apparatus illustrated within FIG. 1 to FIG. 3.

FIG. 7 shows a schematic piping diagram corresponding with a spray stream nozzle incorporated into an apparatus in accord with the preferred embodiment of the method and apparatus of the present invention.

DESCRIPTION OF THE PREFERRED EMBODIMENT

The present invention provides a method and apparatus through which a spray stream nozzle employed in dispensing a photoresist developer solution onto a photoexposed blanket photoresist layer within an integrated circuit may be cleaned to avoid: (1) clogging of the nozzle; or (2) deposition of a particulate residue upon the photoexposed blanket photoresist layer. The method of the present invention provides, subsequent to dispensing a photoresist developer solution from a spray stream nozzle, for purging the spray stream nozzle with a solvent which is not susceptible to clogging the spray stream nozzle. Thus, through the method of the present invention, and through a spray stream nozzle incorporated into an apparatus through which there may alternatively be provided to the spray stream nozzle a volume of photoresist developer solution and a volume of solvent in accord with the method of the present invention, there is provided a spray stream nozzle apparatus which is susceptible to neither clogging nor deposition of a particulate residue upon a photoexposed blanket photoresist layer when dispensing a photoresist developer solution upon the photoexposed blanket photoresist layer when employing the spray stream nozzle.

Figure 1:
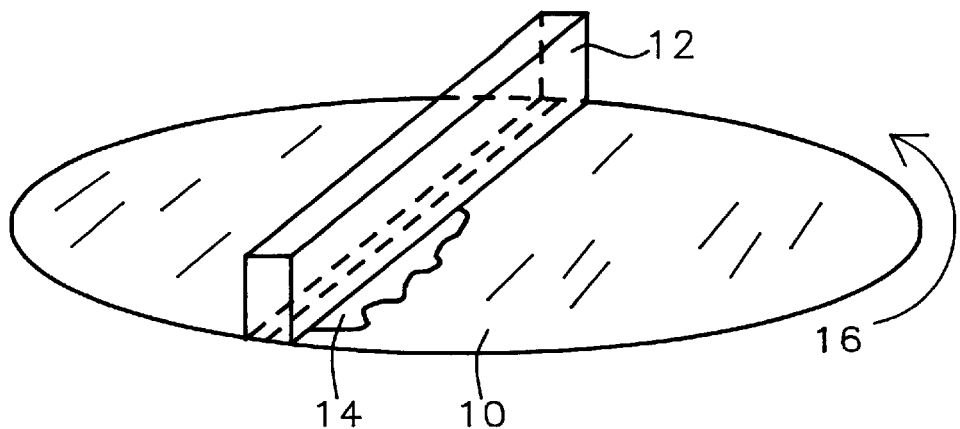
FIG. 1 to FIG. 3 show a series of schematic perspective-view diagrams illustrating a method and apparatus by which a photoresist developer solution is dispensed onto a semiconductor substrate through a spray stream nozzle conventional in the art of integrated circuit fabrication.
Figure 2:
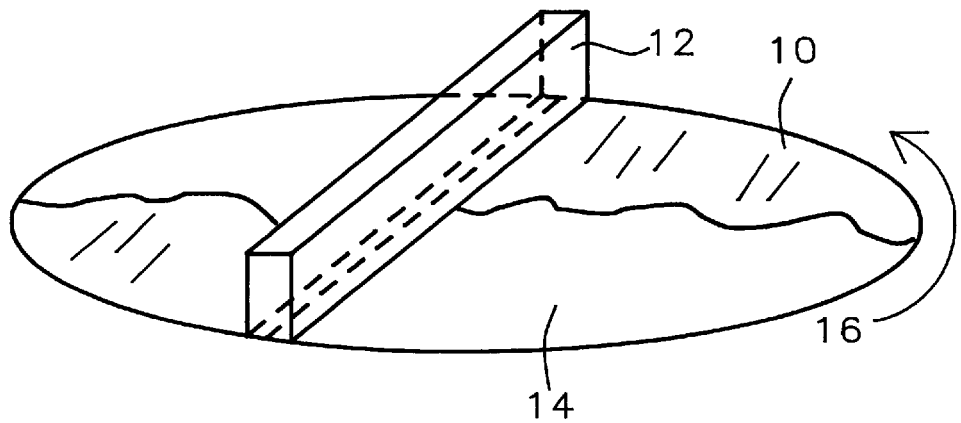
Figure 3:
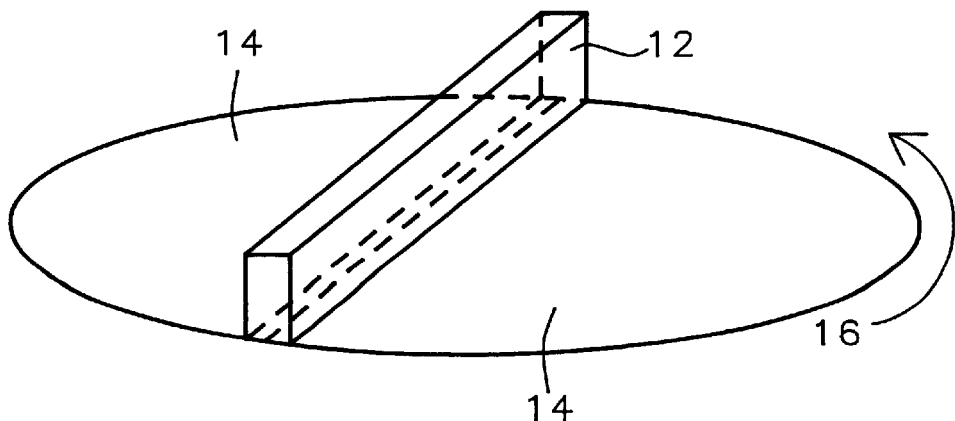

Referring now to FIG. 1 to FIG. 3, there is show a series of schematic perspective-view diagrams illustrating a method and apparatus by which photoresist developer is dispensed over a semiconductor substrate through a spray stream nozzle conventional in the art of integrated circuit fabrication. Illustrated in FIG. 1 is a semiconductor substrate 10 which is placed beneath a spray stream nozzle 12, where there is a relative rotation of the semiconductor substrate 10 with respect to the spray stream nozzle 12 as illustrated by the arrow associated with reference numeral 16. While the semiconductor substrate 10 is rotating with respect to the spray stream nozzle 12 there is sprayed upon the surface of a photoexposed blanket photoresist layer (not shown) formed over the surface of the semiconductor substrate 10 a photoresist developer solution 14. The photoresist developer solution 14 is sprayed from the bottom side of the spray stream nozzle 12, where the bottom side of the spray stream nozzle 12 is typically separated from the photoexposed blanket photoresist layer by a distance of from about 60 to about 90 millimeters (mm). As is illustrated within the schematic perspective-view diagram of FIG. 1, the bottom side of the spray stream nozzle 12 is positioned and spaced parallel from a planar surface of the semiconductor substrate 10. As is shown by the schematic perspective-view diagrams of FIG. 2 and FIG. 3, the photoresist developer solution 14 is dispensed over the semiconductor substrate 10 until the semiconductor substrate 10 is completely covered with the photoresist developer solution 14.

Figure 4:
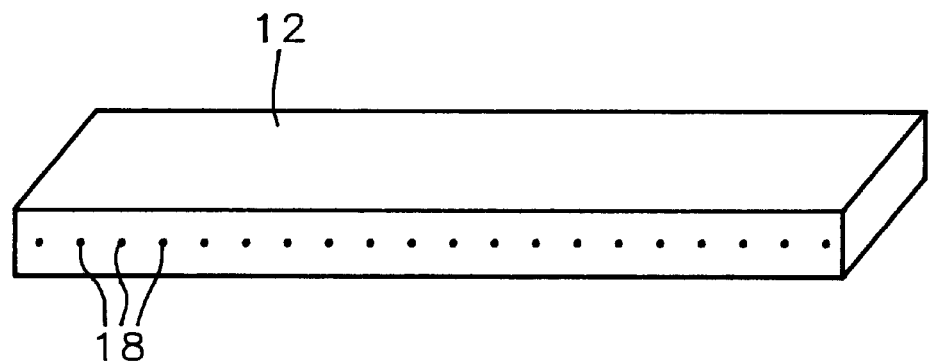
FIG. 4 shows a schematic perspective view-diagram illustrating the bottom surface of the spray stream nozzle illustrated within FIG. 1 to FIG. 3.

Referring now to FIG. 4, there is show a schematic perspective view-diagram illustrating the bottom surface of the spray stream nozzle 12 illustrated within FIG. 1 to FIG. 3. Shown in FIG. 4 is the bottom surface of the spray stream nozzle 12 having a series of apertures 18 formed within the bottom surface of the spray stream nozzle 12. Typically, each aperture within the series of apertures 18 is a circular aperture. Typically each circular aperture within the series of apertures 18 has a diameter of from about 0.05 to about 0.2 millimeters (mm). Most typically, each circular aperture within the series of apertures 18 has a diameter of about 0.1 millimeter (mm). In addition, each circular aperture within the series of apertures 18 is typically separated from an adjoining circular aperture by a pitch of about 0.5 to about 2 millimeters (mm). Most typically, each circular aperture within the series of apertures 18 is separated from an adjoining circular aperture by a pitch of about 1 millimeter (mm).

Figure 5:
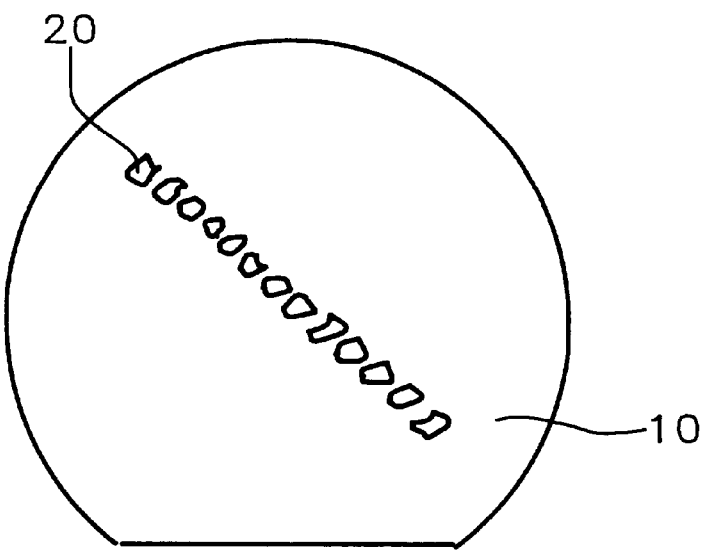
FIG. 5 shows a schematic plan-view diagram of a semiconductor substrate illustrating a particulate residue which is typically formed upon the semiconductor substrate incident to dispensing upon a photoexposed blanket photoresist layer formed over the semiconductor substrate the photoresist developer solution through the method and apparatus as illustrated within FIG. 1 to FIG. 3.

Referring now to FIG. 5, there is shown a schematic plan-view diagram of the semiconductor substrate 10 illustrating a particulate residue 20 which is typically formed over the semiconductor substrate 10 incident to dispensing upon a photoexposed blanket photoresist layer formed over the semiconductor substrate a photoresist developer solution through the method and apparatus as illustrated within FIG. 1 to FIG. 3. As is shown in FIG. 5, the particulate residue 20 is deposited in a line approximately diagonally across the semiconductor substrate 10 at a location corresponding with the initial location of the spray stream nozzle 12 above the semiconductor substrate 10. The particulate residue 20 is typically formed from solids originally dissolved in the photoresist developer solution 14 but from which have evaporated the solvent employed in the photoresist developer solution 14, thus forming a particulate residue 20 which clogs the series of apertures 18 within the spray stream nozzle 12 in addition to forming a particulate residue 20 upon the semiconductor substrate 10.

Although the presence of the particulate residue 20 may be observed with several types and concentrations of photoresist developer solution 14, the presence and magnitude of the particulate residue 20 is typically substantially related to the quantity and nature of the solids dissolved in the photoresist developer solution 14. In general, higher quantities of solids which are substantially susceptible to recrystallization from the photoresist developer solution 14 will simultaneously yield a more dense particulate residue 20 upon the semiconductor substrate 10, as well as a more ready clogging of the series of apertures 18 within the spray stream nozzle 12.

A common, but by no means exclusive, photoresist developer solution 14 which is particularly susceptible to clogging the series of apertures 18 within the spray stream nozzle 12 and depositing a particulate residue 20 upon the semiconductor substrate 10 is an aqueous tetra-methyl-ammonium-hydroxide (TMAH) photoresist developer solution, particularly when employed at higher concentrations of tetra-methy-ammonium-hydroxide (TMAH). Typically, an aqueous tetra-methyl-ammonium-hydroxide (TMAH) photoresist developer solution above a concentration of about 2 weight percent tetra-methyl-ammonium-hydroxide (TMAH) is particularly susceptible to forming a particulate residue 20 upon the semiconductor substrate 10 while simultaneously clogging the series of apertures 18 within the spray stream nozzle 12. Aqueous tetra-methyl-ammonium-hydroxide (TMAH) photoresist developer solutions at lower concentrations are also susceptible to forming particulate residues upon semiconductor substrates and clogging apertures within spray stream nozzles.

Referring now to FIG. 6, there is shown a schematic piping diagram corresponding with the schematic perspective-view diagrams of the method and apparatus illustrated within FIG. 1 to FIG. 3. Shown in FIG. 6 is the spray stream nozzle 12 positioned above the semiconductor substrate 10 which in turn is placed upon a platen 22 which provides for the relative rotation of the semiconductor substrate 10 with respect to the spray stream nozzle 12. There is also shown in FIG. 6 a first connection 24 through which is supplied the photoresist developer solution 14 (not shown) to a photoexposed blanket photoresist layer (not shown) formed over the semiconductor substrate 10.

Referring now to FIG. 7, there is shown a schematic piping diagram corresponding with a spray stream nozzle 12 incorporated into an apparatus in accord with the preferred embodiment of the method and apparatus of the present invention. Shown in FIG. 7 is a schematic piping diagram otherwise equivalent to the schematic piping diagram as illustrated in FIG. 6, with the exception of the addition of a second connection 26 for a solvent which may alternatively be provided to the spray stream nozzle 12 in place of the photoresist developer solution 14. The solvent is preferably not susceptible to clogging the spray stream nozzle 12. Within the preferred embodiment of the method and apparatus of the present invention, the solvent is alternatively provided to the spray stream nozzle 12 by means of manipulation of a three-way valve 28. Preferably, the three-way valve 28 is formed of a material inert to both the photoresist developer solution 14 and the solvent. Typically and preferably the three-way valve 28 is formed of an inert fluoropolymer material, although the three-way valve 28 may be formed of other materials. In addition, other methods for alternatively supplying the photoresist developer solution 14 and the solvent to the spray stream nozzle 12 may also be employed within the method and apparatus of the present invention.

For the preferred embodiment of the method and apparatus of the present invention, the spray stream nozzle 12 has formed therein a minimum of one circular aperture, where the circular aperture preferably has a diameter of from about 0.05 to about 0.2 millimeters (mm). Most preferably, the spray stream nozzle 12 has a series of apertures of diameter about 0.1 millimeter (mm).

For the preferred embodiment of the method and apparatus of the present invention the aqueous tetra-methyl-ammonium-hydroxide (TMAH) photoresist developer solution 14 is preferably provided to the spray stream nozzle 12 at a concentration of from about 0.5 to about 5 weight percent tetra-methyl-ammonium-hydroxide (TMAH) and at a pressure of from about 0.5 to about 0.6 kilograms per square centimeter (kg/cm2) for a time period sufficient to completely develop the photoexposed blanket photoresist layer formed over the semiconductor substrate 10. More preferably, the aqueous tetra-methyl-ammonium-hydroxide (TMAH) photoresist developer solution 14 is provided to the spray stream nozzle 12 at a concentration of from about 2 to about 5 weight percent tetra-methyl-ammonium-hydroxide (TMAH) and at a pressure of from about 0.5 to about 0.6 kilograms per square centimeter (kg/cm2). Most preferably, the aqueous tetra-methyl-ammonium-hydroxide (TMAH) photoresist developer solution 14 is provided to the spray stream nozzle at a concentration of from about 2 to about 3 weight percent tetra-methyl-ammonium-hydroxide (TMAH) and at a pressure of from about 0.5 to about 0.6 kilograms per square centimeter (kg/cm2). Following dispensing of the aqueous tetra-methyl-ammonium-hydroxide (TMAH) photoresist developer solution upon the photoexposed blanket photoresist layer through the spray stream nozzle 12, there is then provided through the spray stream nozzle 12 a volume of a water solvent, preferably but not exclusively a deionized water solvent, preferably at a pressure of from about 3 to about 5 kilograms per square centimeter (kg/cm2) for a time period of from about 60 to about 90 seconds. Under these conditions, the spray stream nozzle 12 is typically and preferably completely purged with the volume of the water solvent.

Upon purging the spray stream nozzle 12 with deionized water solvent in accord with the preferred embodiment of the method and apparatus of the present invention, there is provided a spray stream nozzle 12 which is not susceptible to clogging when the spray stream nozzle 12 and the apparatus into which is provided the spray stream nozzle 12 is subsequently employed in dispensing upon an additional photoexposed blanket photoresist layer upon an additional semiconductor substrate 10 the aqueous tetra-methyl-ammonium-hydroxide (TMAH) photoresist developer solution. In addition, through purging the spray stream nozzle 12 through the preferred embodiment of the method and apparatus of the present invention, there will also not be deposited upon the additional semiconductor substrate 10 a particulate residue 20 when dispensing the aqueous tetra-methyl-ammonium-hydroxide (TMAH) photoresist developer solution upon a photoexposed blanket photoresist layer formed over the additional semiconductor substrate 10 when employing the spray stream nozzle 12.

As is understood by a person skilled in the art, the preferred embodiment of the method and apparatus of the present invention is illustrative of the method and apparatus of the present invention rather than limiting of the method and apparatus of the present invention. Revisions may be made to methods, materials, structures and dimensions through which is provided the method and apparatus of the present invention while still providing a method and apparatus in accord with the spirit and scope of the present invention, as defined by the appended claims.

What is claimed is:

1. A method for cleaning a spray stream nozzle employed in dispensing an aqueous tetra-methyl-ammonium-hydroxide (TMAH) photoresist developer solution upon a photoexposed blanket photoresist layer formed over a semiconductor substrate comprising:

providing a spray stream nozzle having a minimum of one aperture formed therein;

providing through the aperture(s) within the spray stream nozzle a volume of an aqueous tetra-methyl-ammonium-hydroxide (TMAH) photoresist developer solution sufficient to develop a photoexposed blanket photoresist layer formed over a planar surface of a semiconductor substrate placed beneath the spray stream nozzle, where the aperture(s) within the spray stream nozzle are formed in a bottom surface of the spray stream nozzle which is positioned and spaced parallel from the planar surface of the semiconductor substrate; and providing then through the aperture(s) within the spray stream nozzle a volume of a solvent, the volume of the solvent not being susceptible to clogging the spray stream nozzle.

2. The method of claim 1 wherein the aperture is a circular aperture having a diameter of from about 0.05 to about 0.2 millimeters (mm).

3. The method of claim 1 wherein the volume of the aqueous tetra-methyl-ammonium-hydroxide (TMAH) photoresist developer solution is provided through the spray stream nozzle at a concentration of tetra-methyl-ammonium-hydroxide (TMAH) from about 0.5 to about 5 weight percent.

4. The method of claim 3 wherein the volume of the aqueous tetra-methyl-ammonium-hydroxide (TMAH) photoresist developer solution is provided through the spray stream nozzle at a pressure of from about 0.5 to about 0.6 kilograms per square centimeter (kg/cm2).

5. The method of claim 4 wherein the volume of the solvent is a volume of a water solvent.

6. The method of claim 5 wherein the volume of the water solvent is provided through the spray stream nozzle at a pressure of from about 3 to about 5 kilograms per square centimeter (kg/cm2).

7. The method of claim 6 wherein the volume of the water solvent is provided through the spray stream nozzle for a time period of from about 60 to about 90 seconds.

8. A method for cleaning a spray stream nozzle employed in dispensing a photoresist developer solution upon a photoexposed blanket photoresist layer formed over a semiconductor substrate comprising:

providing a spray stream nozzle having a minimum of one aperture formed therein;

providing through the aperture(s) within the spray stream nozzle a volume of a photoresist developer solution sufficient to develop a photoexposed blanket photoresist layer formed over a planar surface of a semiconductor substrate placed beneath the spray stream nozzle, where the aperture(s) within the spray stream nozzle are formed in a bottom surface of the spray stream nozzle which is positioned and spaced parallel from the planar surface of the semiconductor substrate; and providing then through the aperture(s) within the spray stream nozzle a volume of a solvent, the volume of the solvent not being susceptible to clogging the spray stream nozzle.

9. The method of claim 8 wherein the aperture is a circular aperture having a diameter of from about 0.05 to about 0.2 millimeters (mm).

10. The method of claim 8 wherein the volume of the photoresist developer solution is provided through the spray stream nozzle at a pressure of from about 0.5 to about 0.6 kilograms per square centimeter (kg/cm2).

11. The method of claim 8 wherein the volume of the solvent is provided through the spray stream nozzle at a pressure of from about 3 to about 5 kilograms per square centimeter (kg/cm2).

12. The method of claim 8 wherein the volume of the solvent is provided through the spray stream nozzle for a time period of from about 60 to about 90 seconds.

* * * * *